United States Patent [19]

Baker et al.

[11] Patent Number: 4,480,232
[45] Date of Patent: Oct. 30, 1984

[54] METHOD AND APPARATUS FOR DIGITAL AUTOMATIC FREQUENCY CONTROL OF CHIRPED OSCILLATOR

[75] Inventors: Lewin T. Baker; Eugene J. Orlowski, Jr., both of Schenectady, N.Y.

[73] Assignee: General Electric Company, Schenectady, N.Y.

[21] Appl. No.: 471,948

[22] Filed: Mar. 3, 1983

[51] Int. Cl.³ .................. H03B 23/00; H03L 7/08
[52] U.S. Cl. ........................... 331/1 A; 331/4; 331/178
[58] Field of Search ............... 331/1 A, 4, 25, 178

[56] References Cited

U.S. PATENT DOCUMENTS

| | | | |
|---|---|---|---|
| 3,495,195 | 2/1970 | Ribour | 331/178 |
| 3,519,955 | 7/1970 | Mead, Jr. | 331/178 |
| 4,129,832 | 12/1978 | Neal et al. | 331/178 X |
| 4,210,776 | 7/1980 | Van Meter | 331/1 A X |

Primary Examiner—Eugene R. LaRoche
Assistant Examiner—Robert J. Pascal
Attorney, Agent, or Firm—Geoffrey H. Krauss; James C. Davis, Jr.; Marvin Snyder

[57] ABSTRACT

The average frequency and sweep rate of a chirped oscillator are automatically digitally controlled for correction of long term drift. During each of successive swept-frequency chirps, the swept frequency output of a voltage-controlled oscillator is counted and the overflow time of the counter is utilized to control the average frequency. A second counter counts the chirp frequency in a first direction during a first preset period at the beginning of each chirp and counts the chirp frequency in a second and opposite direction during an identical preset period later in the chirp, to provide an underflow transition related to the slope of the chirped frequency signal. Digital circuitry for synthesis of the chirped oscillator frequency ramp signal, and for correction of the average frequency and slope thereof responsive to the first and second counter transitions, is utilized.

28 Claims, 13 Drawing Figures

METHOD AND APPARATUS FOR DIGITAL AUTOMATIC FREQUENCY CONTROL OF CHIRPED OSCILLATOR

BACKGROUND OF THE INVENTION

The present invention relates to chirped-frequency oscillators and, more particularly, to novel methods and apparatus for digital automatic generation of the chirped-frequency signal and for automatic correction of average frequency and sweep rate thereof.

In co-pending application Ser. No. 331,491, filed Dec. 17, 1981, assigned to the assignee of the present invention and incorporated herein by reference in its entirety, methods and circuitry for chirped oscillator automatic frequency control are described and claimed. This circuitry utilizes analog subcircuits for generation of a swept-frequency signal waveform from a chirped oscillator. In one intended use, with power-line-carrier transceivers, the circuitry (located in each of a plurality of stations of a distributed system) must generate the appropriate chirped signal, without adjustment or maintenance, over a period of many years. The stability requirements for the chirped oscillator in each transceiver of such a system requires that long term drift in certain elements of the control loops be reduced or eliminated. The circuitry of the aforementioned application obtains correction signals by comparing fixed reference voltages with the voltage output from digital-to-analog converters following a set of counters. Long term drift in the reference voltages applied to the digital-to-analog converter and/or in the fixed reference voltages cause output frequency errors. Thus, while frequency drifts in an analog ramp generator and a voltage-controlled oscillator can be corrected, the circuitry of the co-pending application contains numerous analog portions in its error detecting circuitry, which analog portions have certain drifts which cannot be corrected for over the required period of time. It is therefore desirable to provide methods and circuitry for automatic frequency control of a chirped oscillator which utilizes digital means for deriving corrective error signals of binary nature, to provide the required long-term stability. It is further desirable to provide digital automatic frequency control circuitry and methods in which the only source of error is the error, if any, of a common time-base element.

BRIEF DESCRIPTION OF THE INVENTION

In accordance with the invention, our novel methods and apparatus for digital automatic control of the average frequency and frequency ramp rate of a swept-frequency chirp signal from a voltage-controlled oscillator (VCO), uses a common clock signal which is frequency-divided to provide a sequence of states, during each chirp time interval, to the inputs of a digital-to-analog converter. The converter output is a step-wise staircase approximation of the voltage ramp signal to be supplied to the VCO to generate the required chirp signal. The converter output signal magnitude is responsive to a first error signal to adjust ramp magnitude, and therefore ramp rate. The converter output signal is level-shifted in a circuit responsive to a second error signal, in which the average chirp signal frequency is adjusted. The ramp voltage waveform is subjected to a degree of integration to smooth the staircase steps and is applied to the VCO control input to generate the required chirp frequency signal.

A unidirectional first counter counts the number of cycles in each chirp and is preset such that a transition occurs at the counter most-significant-bit output when the required number of cycles, for the selected average frequency, occurs. The transition is compared to a reference timing signal derived from the common clock signal, to generate an average-frequency-error signal, which is fed back as the second error signal for correction of the average frequency of the chirped oscillator.

A bidirectional second counter counts, in a first direction, the number of cycles during the first quarter of each chirp and counts the number of cycles in the last quarter of each chirp in the opposite direction. This counter is preset such that a transition signal occurs when the total count is zero. The time at which the zero transition occurs is compared to the reference timing signal to generate a ramp-rate error signal, which is fed back as the first error signal, for correction of the frequency-rate error of the chirped oscillator.

Accordingly, it is an object of the present invention to provide novel digital circuitry for controlling the average frequency and/or the sweep rate of a chirped oscillator.

It is another object of the present invention to provide novel methods for digital automatic control of chirped frequency oscillator average frequency and frequency rate.

These and other objects of the present invention will become apparent upon consideration of the following detailed description, when read in conjunction with the drawings.

DETAILED DESCRIPTION OF THE DRAWINGS

Figure 1A:
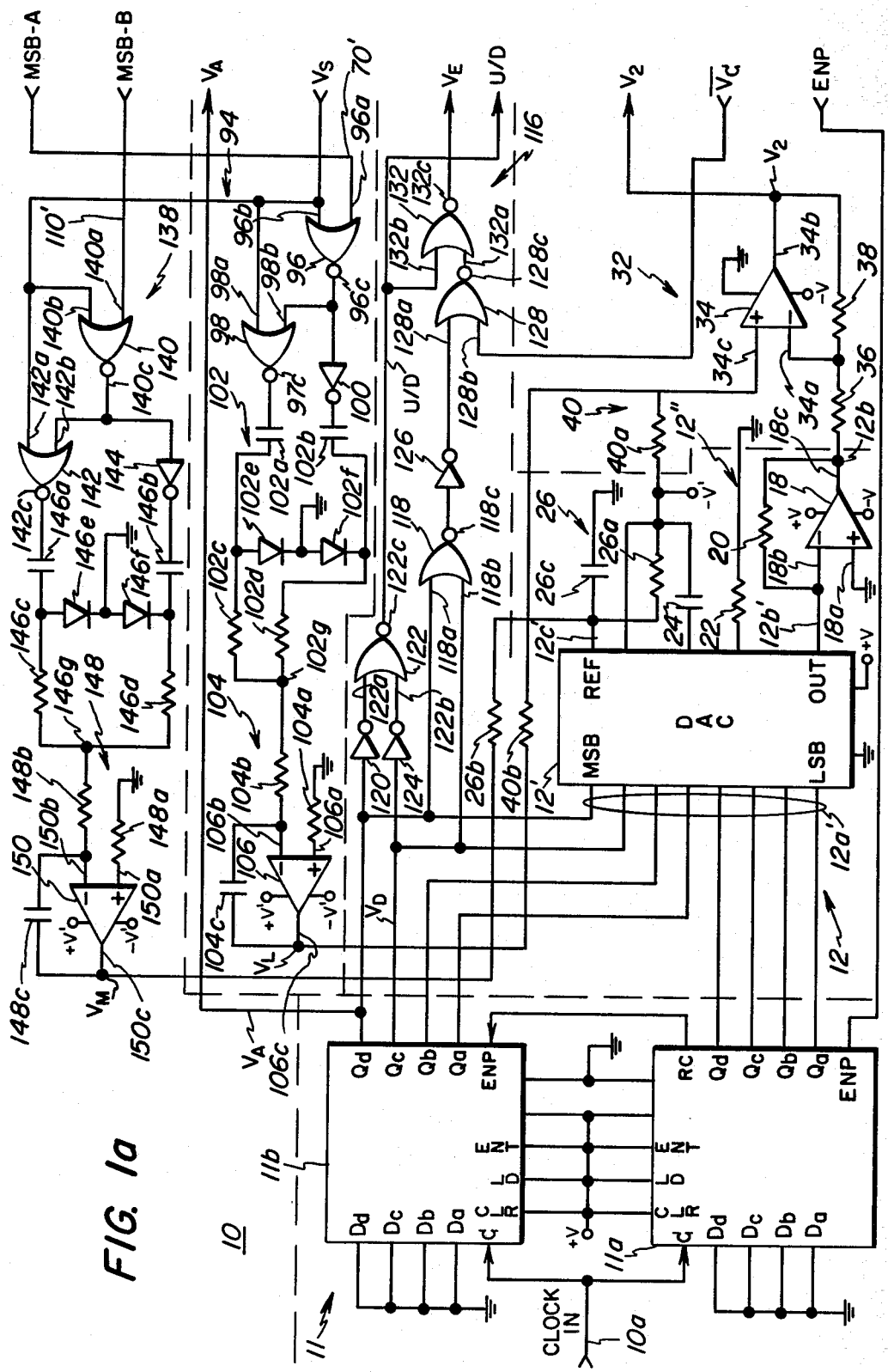
Figure 1B:
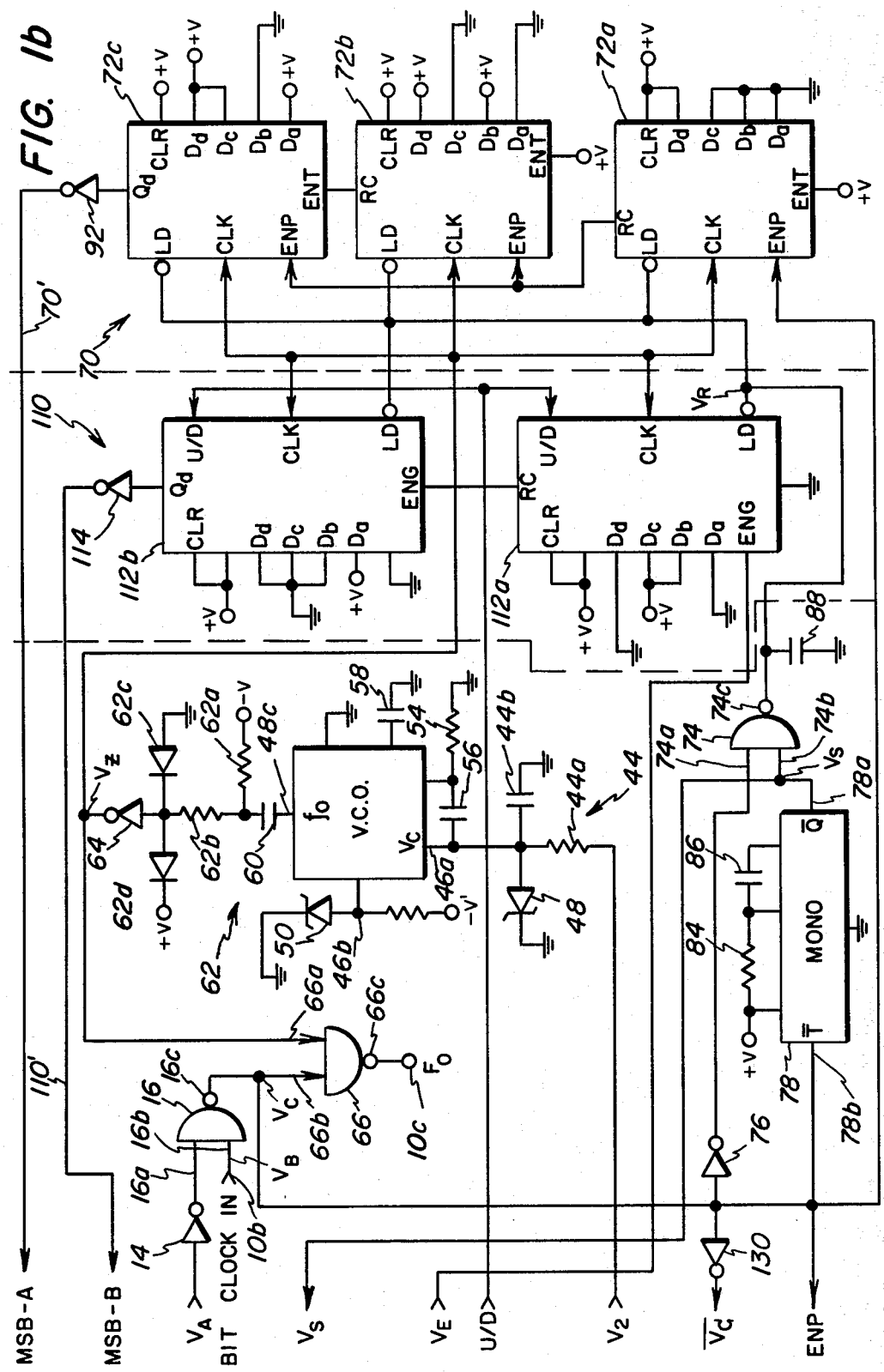

FIGS. 1a and 1b are coordinated portions of the schematic diagram of a chirped oscillator and digital automatic frequency control system therefor, in accordance with the principles of the present invention; and FIGS. 2a–2k are a set of coordinated graphs illustrating operational waveforms in the circuit of FIGS. 1a and 1b.

DETAILED DESCRIPTION OF THE INVENTION

Referring to the drawings, a chirped oscillator automatic digital frequency control system 10 receives a stable clock signal at a system clock input 10a. Advantageously, the clock input signal has a square waveform and is generated by a crystal-controlled oscillator (not shown) of any of the myriad types well known to the art. System 10 also receives a bit clock input signal at a second system input 10b; each occurance of the bit clock signal, which may have a square waveform, has a duration $T_2$ greater than the duration $T_1$ of an associated chirp time interval. A suitable means for generating the bit clock input signal is shown in FIG. 3a of co-pending application Ser. No. 301,706, filed Sept. 14, 1981, assigned to the assignee of the present invention and incorporated herein by reference in its entirety. The chirped frequency output signal is provided at a system output frequency $F_0$ terminal 10c. This chirped frequency output signal has a waveform which is advantageously a substantially-constant-amplitude sinusoid starting at a first frequency, e.g. 550 KHz., at the start of each chirp time interval $T_1$ and substantially-linearly increasing in frequency during the chirp time interval $T_1$, e.g. 1,000 microseconds, to a final frequency, e.g. 650 KHz. The chirped frequency signal has an average frequency and oscillates for a known number of cycles, i.e. as given by the product of the average frequency and the chirp time interval $T_1$ duration, and also has a certain slope, i.e. given by dividing the chirp frequency difference, from lowest to highest frequency, by the chirp time interval. Illustratively, for a 600 KHz. average frequency and a 1,000 microsecond chirp duration $T_1$, each chirp contains 600 sinusoidal cycles and has a slope of $10^8$ Hz. per second. It should be understood that the foregoing numbers are utilized by way of example only, and that other starting, ending and average frequencies and other chirp time intervals can be equally as well utilized without departing from the spirit and intent of the present invention. Similarly, while the bit clock input signal illustrated is a waveform having a frequency of about 960 Hz. (utilized for transmitting a pair of 8-bit bytes of information during each cycle of the power line frequency, e.g. 60 cycles in the United States, and thus giving a bit clock frequency of 60 Hz.×16 bits=960 Hz.), other bit clock frquencies can be equally as well utilized.

The clock waveform at input 10a is applied to a counter means 11, to provide a sequentially increasing digital count to the digital inputs 12a of a digital-to-analog converter (DAC) means 12, which provides a linear staircase voltage, between zero and a reference voltage, at an output 12b thereof. Advantageously, counter 11 is a multistage binary counter for use with a DAC means having binary-scaled digital inputs 12a. It should be understood that, if a DAC means 12 is utilized having other input scaling, counter means 11 is adapted accordingly. The number of input bits, e.g. 8 bits in the example, determines the maximum number e.g. $2^8=256$, of steps in the staircase voltage at output 12b, as well as determining the type and number of stages in counter 11. The clock input signal frequency $f_{in}$, at input 10a, is given by the number n of steps in the voltage staircase waveform and the chirp time interval $T_1$, e.g. $f_{in}=n/T_1$. In one preferred embodiment, where $T_1=1000$ microseconds and $n=256$, $f_{in}=256$ KHz.

DAC means 12 includes an 8-bit-binary-input digital-to-analog converter 12', such as the type 1408 converter available from Motorola or Signetics and the like, and division counter 11 is an 8-bit binary divider formed of a pair of standard TTL 74163 integrated circuits and the like. Each of the 4-bit binary counter portions 11a and 11b receives the clock input signal at a clock C input from system input 10a. As required for the particular 8-bit counters 11a and 11b utilized, the clear CLR, load LD and first enable ENP inputs are all connected to a positive logic +V potential, also utilized to supply basic operating potential to counter portions 11a and 11b, with respect to ground potential. The particular counter portion integrated circuits are of the presettable variety, whereby data inputs $D_a$–$D_d$ are all connected to ground potential, such that the counter portions are preloaded to a zero count, responsive to a low, logic 0 level at the second enable ENP input thereof. Thus, the 4-bit outputs $Q_a$–$Q_d$ of each of counter portions 11a and 11b are set to logic low levels responsive to a logic 0 level at the ENP input thereof, and, responsive to a high, logic 1 level at the ENP input, sequentially count the clock input waveform pulses at the clock C inputs of the counter. The least significant bit (LSB) output $Q_a$ of counter portion 11a will thus provide 256 state changes in the desired chirp time interval $T_1$. The second most significant bit (2nd MSB) output $Q_c$ of counter portion 11b provides a waveform of two cycles and the most significant bit (MSB) output $Q_d$ of counter portion 11b provides a single cycle waveform during the desired chirp interval $T_1$. The 8 bit outputs (bit outputs $Q_a$–$Q_d$ of first counter portion 11a and bit outputs $Q_a$–$Q_d$ of second counter portion 11b), are connected in parallel to the 8-bit inputs 12a of DAC means 12. The most significant bit MSB output voltage $V_A$ signal (waveform of FIG. 2a) is also connected through an inverter 14 to one input 16a of a first 2-input NAND gate 16, having its remaining input 16b connected to the bit clock input 10b of the system, at which the bit clock waveform $V_B$ (FIG. 2e) appears. The waveform $V_C$ ((FIG. 2f) of the signal at the first NAND gate output 16c (FIG. 2f) is at a logic 1 level for the chirp interval $T_1$, and is at a resetting, logic 0 level for a time period $T_3$, e.g. about 41.67 microseconds, which is the difference between the bit clock cycle time interval $T_2$ (of 1/960 Hz., or about 1041.67 microseconds) and the $T_1$ interval of 1,000 microseconds. First gate output 16c is connected back to the enable ENP input of first counter portion 11a, for resetting counter 11 during the reset interval $T_3$ after each chirp interval $T_1$. Thus, counter 11 is reset at the end of each bit clock interval $T_2$, counts through its full $2^N$ states in the chirp interval $T_1$ and is then again reset preparatory to counting through another $2^N$ states in the next chirp interval at the beginning of the next subsequent bit clock cycle.

Because the converter output 12b' signal is a current for the particular converter 12' used, DAC means 12 includes a current-to-voltage converter circuit 12'', utilizing a first operational amplifier 18. Operational amplifier 18 has a non-inverting +input 18a connected to ground potential and an inverting −input 18b connected to the converter current output OUT terminal 12b'. A scaling resistance 20 is connected between inverting input 18b and the operational amplifier output 18c, at the DAC subcircuit output 12b, at which a ramp voltage $V_1$ (FIG. 2b) appears. The particular converter 12' receives operating potential +V and negative operating potential −V', both with respect to ground potential, and has connected thereto such resistance elements 22 and capacitive elements 24 as required for operation of the specific DAC converter used. Converter 12' also receives a reference voltage at a reference REF input 12c', for determining the amplitude of the output current, at output 12b', and the magnitude of the $V_1$ voltage at output 12b. The reference voltage at input 12c' is provided at the output of a voltage divider 26, having a first resistance element 26a connected between the negative operating potential −V' source and the reference input, and a second resistance element 26b connected between the reference input 12c and a first correction voltage $V_M$. Thus, as counter 11 cycles through its $2^N=256$ states, the voltage $V_1$ (FIG. 2b) rises in a staircase-like approximation of a ramp voltage 28, from a substantially zero voltage at time $t_0$ (at which time counter 11 has been reset responsive to the leading edge 30 of the bit clock waveform (FIG. 2f)) and reaches a maximum voltage $V_X$ at time $t_1$, at the end of the chirp interval $T_1$; the maximum voltage $V_X$ magnitude is dependent upon the reference voltage at the REF input 12c', which is itself dependent upon the magnitude of first correction (or error) voltage $V_M$. The DAC means output voltage $V_1$ falls to a substantially zero voltage portion 28a at time $t_1$, which substantially zero voltage is maintained during reset interval $T_3$ (see FIG. 2f) until the logic 0 level at the counter ENP input is released, whereupon another step-wise ramp approximation waveform portion 28' commences, e.g. as at time $t_2$. It should be noted that the large number, e.g. 256, of steps in ramp 28 is not easily discernable in the illustrated waveforms.

The step-wise ramp voltage $V_1$ is applied to the input of an adjustable-offset inverting means 32, utilizing a second operational amplifier 34. Whereas first operational amplifier 18 receives positive and negative operating potentials $+V$ and $-V$, as required to allow the output voltage $V_1$ to be substantially at zero volts at the start of each ramp, the second operational amplifier 34 receives only a negative operating potential $-V$, with respect to ground potential, as the output voltage $V_2$ thereof will always be of negative amplitude. An inverting - input 34a of the second operational amplifier is connected through an input resistance 36 to the DAC means output 12b and is connected through a feedback resistance 38 to operational amplifier output 34b, at which output the voltage $V_2$ waveform (FIG. 2c) is obtained. A non-inverting +input 34c is connected to the output of another voltage divider 40, having a first resistance 40a connected between input 34c and negative operating potential $-V'$. A second voltage divider resistance 40b is connected between input 34c and a source of a second correction (or error) voltage $V_L$. It will thus be seen that the controlled inverter output voltage $V_2$ is a step-wise approximated ramp voltage waveform 42 commencing at a negative voltage, e.g. $-V_0$, at time $t_0$ and substantially linearly step-wise decreasing in magnitude to a maximum negative-polarity magnitude of $-(V_0+V_X)$ at time $t_1$, at the end of the chirp time interval. Thereafter, in reset time interval $T_3$, the waveform falls to, and is maintained during portion 42a at, the initial $(-V_0)$ level, before starting a next negative-going ramp 42' at time $t_2$. The inverted, offsetted-ramp $V_2$ voltage is applied through an integrator means 44, comprised of a series resistance 44a and a shunt integration capacitance 44b, to the control voltage $V_c$ input 46a of a voltage-controlled oscillator (VCO) means 46. The integrator serves to smooth most of the staircase-like steps, in voltage $V_2$, into a gradually-changing, monotonic voltage ramp. A zener diode 48 is connected between control input 46a and ground potential, to prevent an excessively large control voltage from being supplied to input 46a, in the event that a voltage spike, or other deleterious signal, appears.

Figure 2A:
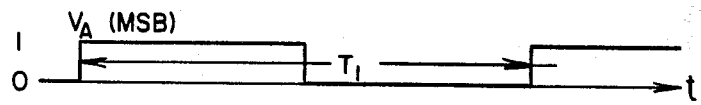
Figure 2B:
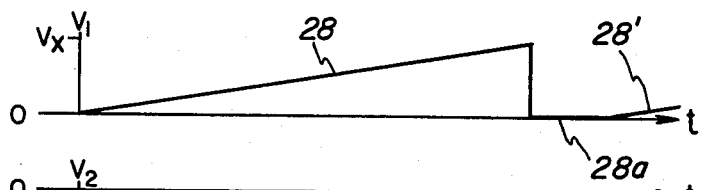
Figure 2C:
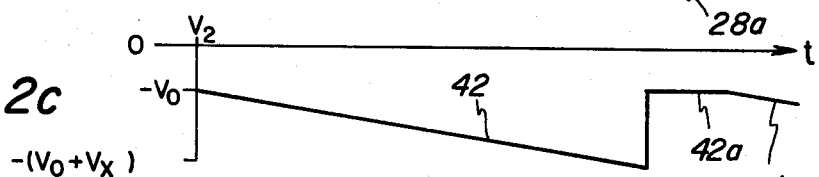
Figure 2D:
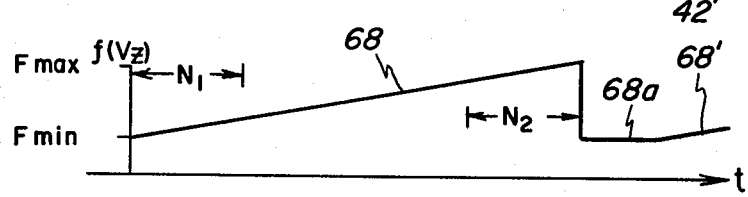
Figure 2E:
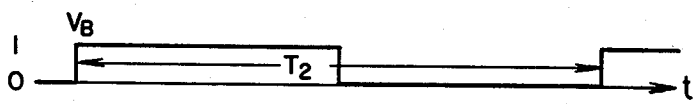
Figure 2F:
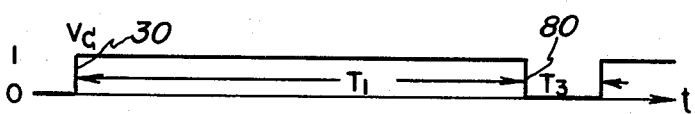
Figure 2G:
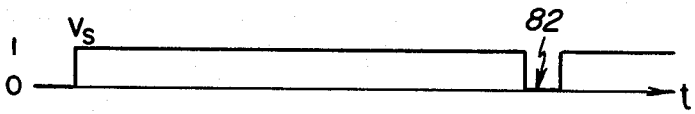
Figure 2H:
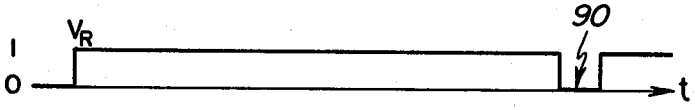
Figure 2I:
Figure 2J:
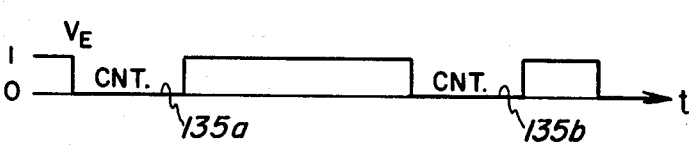
Figure 2K:
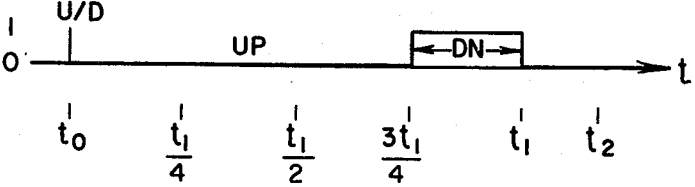

VCO means 46 is provided with a regulated operating potential, at an input 46b, by means of a zener regulating diode 50, connected between input 46b and ground potential, operating in conjunction with a series resistance 52, connected between input 46b and the negative operating potential $-V'$ source. Advantageously, VCO 46 is an integrated circuit type, such as the LM566 integrated circuit available from National Semiconductor and the like. For the particular VCO 46 selected, various resistance elements, such as resistance 54, and capacitive elements, such as capacitors 56 and 58, will normally be required to set the output frequency $f_0$ and sweep-response characteristics of the signal at a VCO output 46c, responsive to the magnitude of the control $V_c$ voltage at input 46a. A coupling capacitor 60 couples the swept-frequency $f_0$ output from the VCO 46 to an amplitude clamp means 62. The clamp utilizes a first resistance 62a connected between operating potential $-V'$ and coupling capacitor 60 and a second series resistance element 62b coupled between capacitor 60 and the junction of a pair of clipping diodes 62c and 62d. The anode of diode 62c is at ground potential, while the cathode thereof is connected to resistance 62b and to the anode of diode 62d, having its cathode at operating potential $+V$. Clamping means 62 assures that the amplitude of the swept-frequency signal, applied to the input of an inverting buffer means 64, does not exceed the maximum voltage limits of the inverting buffer input. The buffered, swept-frequency waveform voltage $V_Z$, at the output of buffer 64, is applied to one input 66a of a second 2-input NAND gate 66, receiving, at the remaining input 66b thereof, the $V_C$ waveform from the first gate output 16c. The second gate output 66c provides the gated chirp frequency $F_0$ voltage waveform for the system output 10c. Thus, the signal waveform at the output of buffer 64 has an instantaneous frequency $f(V_Z)$ as shown in FIG. 2d; at time $t_0$, at the start of a chirp interval $T_1$, the control voltage $V_C$ magnitude, e.g. approximately $-V_0$ volts, provides the minimum chirp frequency $F_{MIN}$. Thereafter, the chirp frequency substantially linearly increases, along portion 68, until a maximum instantaneous frequency $F_{MAX}$ is reached at time $t_1$. During resetting interval $T_3$, the instantaneous frequency reverts to the minimum frequency $F_{MIN}$, in portion 68a, until a next frequency chirp portion 68' commences at time $t_2$. Illustratively, for a chirp frequency interval $T_1$ wherein the time between time $t_0$ to time $t_1$ is 1,000 microseconds, with a minimum frequency $F_{MIN}$ of 550 KHz. and a maximum frequency $F_{MAX}$ of 650 KHz., the peak magnitude $V_X$ of the first voltage $V_1$ (FIG. 2b) is about 0.3 volts positive, while the $V_2$ voltage waveform (FIG. 2c) has a resting $-V_0$ level of about $-1.0$ volts and a maximum negative peak voltage, i.e. $-(V_0+V_X)$ of about $-1.3$ volts, for the particular VCO integrated circuit and values of resistance 54 and capacitances 56 and 58 utilized.

It will be seen that output 10c is effectively at a low, logic 0 level during reset interval $T_3$, so that only the swept-frequency sinusoidal chirp voltage is present from time $t_0$ to time $t_1$, and the minimum frequency $F_{min}$ voltage during portion 68a is effectively removed from output 10c.

Long-term drift in the VCO parameters are corrected by error signals $V_L$ and $V_M$, responsive to digitally-derived signal transitions. Average frequency error is derived by counting the number of cycles, e.g. 600, during the entire chirp interval $T_1$, in a second counter means 70. In the particular embodiment illustrated, 4-bit counter integrated circuits, such as the standard TTL 74163 integrated circuits and the like, are utilized; as a pair of counters I.C.s would provide only an 8-bit counter, with a maximum 256 count, three integrated circuit 4-bit counters 72a–72c are utilized, with a maximum count of $2^{12}=4096$ which is greater than the required, e.g. 600, count. Counter 70 is preset such that counter 70 overflows, with a change in state in the most significant bit $Q_d$ output of counter portion 72c, when the correct count is reached. The time at which overflow occurs is compared to a time reference derived from the main clock input signal. If the average frequency of the chirped VCO means 64 is too high, overflow of counter 70 occurs (and an MSB-A line 70a is raised to a logic 1 level) before the $V_A$ signal changes state at the end of interval $T_1$. Conversely, if the average frequency is too low, counter 70 overflows (and line 70' is raised to a logic 1 level) at a time after the positive-going transition of the $V_A$ signal. Counter 70 overflow is brought about by providing the $V_Z$ chirped oscillator signal in parallel to each of the clock CLK inputs of counter portions 72a–72c, for counting of the chirped oscillator cycles, after a preset count is loaded into the counter. The preset count is loaded responsive to a logic 0 level of a resetting voltage $V_R$ waveform applied to the load LD inputs thereof. The resetting $V_R$ waveform (FIG. 2h) is provided at the output 74c of a third NAND gate 74. A first input 74a of this gate is connected to the output of an inverter 76, receiving the $V_C$ signal at its input. The remaining input 74b of the third gate is connected to the $\overline{Q}$ output of a monostable multivibrator means 78. The negative-transition trigger $\overline{T}$ input 78b of the monostable multivibrator receives the $V_C$ input waveform. Thus, responsive to the negative-going transition 80 of the $V_C$ waveform (FIG. 2f) at the end of each chirp interval $T_1$, monostable multivibrator 78 is triggered and provides a logic 0 pulse 82 in the $V_S$ voltage waveform (FIG. 2g) at the $\overline{Q}$ output 78a thereof. The duration of pulse 82 is established by the values of a timing resistance 84 and timing capacitance 86 associated with monostable multivibrator 78. Advantageously, the multivibrator 78 is a standard TTL type 74122 multivibrator integrated circuit and the like. The resetting voltage $V_R$ waveform at gate output 74c appears across capacitor 88, and is enabled to a logic 0 pulse 90 only during that portion of the $V_C$ pulse 80 after the logic 0 $V_S$ pulse 82 is completed, and before the start of the next frequency chirp at time $t_2$.

The first enable ENT inputs of counter 72a and 72b are connected to positive operating potential +V. The first enable ENT input of third counter portions 72c is connected to the ripple count RC output of second counter portion 72b. The ripple counter RC output of first counter portion 72a is connected in parallel to the second enable ENP inputs of second and third counter portions 72b and 72c, while the second enable ENP input of first counter portion 72a receives the $V_C$ enable signal. Counter 70 is a single-direction-counting (up) counter, whereby the data inputs $D_a$–$D_d$ of each of the three counter portions 72a–72c must be preset to a number less than the maximum 4096 count, by the number of cycles to be counted in a single chirp time interval $T_1$. In the illustrated embodiment, 600 cycles occur in interval $T_1$, whereby the counter is preset to 4096−600=3496. This decimal number is equivalent to the 12-bit binary equivalent 110110101000. Accordingly, the logic 0 preset data bits are provided by connecting to ground potential the $D_a$–$D_c$ preset data inputs of portion 72a, the $D_a$ and $D_c$ preset data inputs of portion 72b and the $D_b$ preset data input of portion of 72c. The logic 1 preset data bits are provided by connecting to a logic 1 level (+V potential) the $D_d$ preset data input of portion 72b, the $D_b$ and $D_d$ preset data inputs of portion 72b and the $D_a$, $D_c$ and $D_d$ preset data inputs of portion 72c. Thus, counter 70 is preset to the 3496 count responsive to each pulse 90 of the $V_R$ waveform, and thereafter counts 600 cycles during the next subsequent chirp time interval $T_1$. Upon counting 600 cycles, the counter reaches the 4096 count state and the most significant bit $Q_d$ output of portion 72c (previously set to the logic 1 state by the $D_d$ preset data bit logic 1 input) changes state and falls to the logic 0 level. This logic 0 level is inverted to a logic 1 level by an inverter 92, whereby a logic 1 level appears on the MSB-A line 70'. This transition to the logic 1 level appears exactly at time $T_1$ if the average frequency is correct, but appears before time $t_1$ if the average frequency is too high and appears after time $t_1$ if the average frequency is too low.

The MSB-A transition is applied to one input of an average-frequency-error-signal generator means 94, which also receives the $V_S$ signal from the monostable multivibrator output 78a. The MSB-A signal is applied to one input 96a of a first 2-input NOR gate 96. The remaining input 96b of this gate, and a first input 98a of a second 2-input NOR gate 98, receives the $V_S$ signal. The output 96c of gate 96 is connected to the remaining input 98b of gate 98, and to the input of an inverter 100. The second NOR gate output 98c and the output of inverter 100 are connected to an error voltage generator means 102 in which the signals are each applied to an associated one a pair of capacitance elements 102a or 102b, each in series with an associated one of resistors 102c or 102d. A first diode 102e is poled to conduct for positive voltages at the junction capacitor 102a and resistor 102c, while a second diode 102f is poled to conduct for negative voltages at the junction of capacitor 102b and resistor 102d. Dependent upon when the positive-going transition on MSB-A line 70' occurs with respect to the negative-going transition of the $V_S$ signal, the magnitude and polarity of an error voltage (at the junction 102g between resistors 102c and 102d) is established. This error voltage is integrated by an average frequency error signal generator integrating means 104. Integrating means 104 uses an operational amplifier 106 having a non-inverting+input 106a connected to ground potential through compensating resistor 104a, an inverting - input 106b connected to the error junction 102g through an input resistance 104b, and an output 106c connected through an integrating capacitor 104c to input 106b. The integrated error voltage appears at output 106c as the first correction voltage $V_L$, for application to resistance 40b of the voltage divider 40. A change in voltage $V_L$ changes the offset voltage $V_O$ (see FIG. 2c) which directly determines the starting frequency, and indirectly determines the ending frequency of the frequency chirp, and therefore controls the chirp average frequency. Thus, if the average frequency is too high, overflow occurs in counter 72 before the end of chirp interval $T_1$ and a positive error signal voltage $V_L$ is provided to reduce the starting frequency voltage $V_0$. If the average frequency is too low, the end of chirp interval $T_1$ will occur before overflow is reached and a negative error voltage $V_L$ is provided to increase the starting voltage $V_0$ and the VCO means starting frequency.

The slope of the chirp frequency portion 68 (see FIG. 2d) is tested by counting the number $N_1$ of oscillator cycles in a first portion, i.e. the first one-quarter, of the chirp interval $T_1$, and subtracting from the first count number $N_1$ a second counted number $N_2$, i.e. the number of cycles counted during the same time interval, i.e. one-quarter of the total chirp time interval $T_1$, at the end of the same chirp. An up/down-controllable-counting counter means 110 is utilized for this ramp counting function. The duration of the up-counting interval, from time $t_0$ to time $t_1/4$, and of the down-counting interval, from time $3t_1/4$ to time $t_1$, are each established as one-quarter of the total chirp interval by use of the most significant bit logic waveform voltage $V_A$ and the second most significant bit logic waveform voltage $V_D$ respectively available at the $Q_d$ and $Q_c$ outputs of the second portion 11b of clock divider means 11. The up/down counter 110 is a presettable up/down counter having a most significant bit $Q_d$ output which overflows (changes state) when the up-counted initial cycle number $N_1$ plus a preset count is equal to the down-counted number $N_2$ of oscillator cycles. For the illustrated frequencies, $N_1=140.625$ cycles and $N_2=159.375$ cycles. The difference $(N_2-N_1)$ is about 19 counts; the preset count, utilized with the particular standard TTL 74191 4-bit binary up/down counter integrated circuits and the like, is empirically increased to an initial preset count of 22, apparently because of three extraneous down counts introduced by transitions of either the up/down control U/D waveform or the enable $V_E$ waveform utilized. As the maximum count in either direction is greater than $2^4=8$ and is less than $2^8=256$, a pair of 4-bit counting portions 112a and 112b are utilized. Greater or lesser numbers of counting stages in counter 110, as well as in counters 11 and 70, can be utilized dependent upon the particular parameters of a desired frequency chirp waveform signal to be controlled.

Both of counter portions 112a and 112b receive the chirped frequency $V_Z$ waveform in parallel at their clock CLK inputs and receive the $V_R$ resetting waveform in parallel at their load LD inputs. The ripple-count RC output of the first counter portion 112a is connected to the gate-enable ENG input of second counter portion 112b. The most significant bit $Q_d$ output of second portion 112b is connected through an inverter 114 to a most significant bit MSB-B line 110'. To preset the desired, e.g. decimal 22, bit count, the decimal number 22 is converted to its 8-bit binary equivalent number 00010110. This binary bit pattern is provided at the preset data inputs $D_a$–$D_d$ of the first and second portions. Thus, the logic 0 bits are provided by connection to ground potential at the $D_a$ and $D_d$ preset data inputs of first counter portion 112a and at the preset data inputs $D_b$, $D_c$ and $D_d$ of second portion 112b. The logic 1 inputs are provided by connection to positive operating potential $+V$ of the $D_b$ and $D_c$ preset data inputs of first portion 112a and at preset data input $D_a$ of second portion 112b. The gated-enable ENG input of first portion 112a receives an enable voltage $V_E$ and the up/down control U/D inputs of both portions 112a and 112b receive an up/down control U/D voltage waveform, from the output of a counter-controlling means 116.

Counter-controlling means 116 receives the most-significant bit $V_A$ waveform and the second-most-significant-bit $V_D$ waveform from counter means 11. The most-significant-bit $V_A$ voltage waveform is applied directly to a first input 118a of a 2-input NOR gate 18, and is applied through an inverter 120 to a first input 122a of another 2-input NOR gate 122. The second-most-significant bit $V_D$ voltage waveform is applied directly to the remaining input 118b of gate 118 and applied through another inverter 124 to the remaining input 122b of gate 122. The output 122c or NOR gate 122 is the up/down U/D signal for connection to the up/down controlling U/D inputs of counter portions 112a and 112b. The output 118c of NOR gate 118 is applied through an inverter 126 to a first input 128a of another 2-input NOR gate 128, having its remaining input 128b receiving a $\overline{V_C}$ signal at the output of an inverter 130; which receives the $V_C$ signal at its input. The output 128c of gate 128 is connected to a first input 132a of another 2-input NOR gate 132. The U/D signal at gate output 122c is also applied to the remaining input 132b of NOR gate 132, at the output 132c of which is provided the enable $V_E$ waveform voltage for connection to the gated enable ENG input of counter portion 112a. Thus, by combining the most significant bit waveform $V_A$ voltage (FIG. 2a) and the second-most-significantbit waveform $V_D$ voltage (FIG. 2i) the enable voltage $V_E$ waveform (FIG. 2j) is provided at a resting logic 1 level, with first and second portions 135a and 135b at a count-enabling logic 0 level. Each of portions 135a and 135b is of a duration equal to exactly one-quarter of the total chirp frequency interval $T_1$ duration. First portion 135a occurs for the first one-quarter of the chirp interval, i.e. from starting time $t_0$ to time $t_1/4$, while second portion 135b commences when the chirp is three-quarters completed, at time $3t_1/4$, and terminates at time $t_1$ when the chirp interval $T_1$ is completed. The U/D waveform (FIG. 2k) is normally at the logic 0 level, controlling counter 110 to the up-counting UP state, and only provides a logic 1 level, controlling the counter to the down-counting DN state, in the last one-quarter of the chirp time interval.

Up/down counter means 110 thus is loaded with the initial count, e.g. 22, responsive to the logic 0 resetting pulse 90 (FIG. 2h) prior to a chirp interval $T_1$. Thereafter, the $V_E$ enable voltage falls to the logic 1 level at time $t_o$ and enables up-counting for one-quarter of the chirp interval. If the chirp frequency ramp rate is correct, the count in counter 110 increases by 140 counts, to a count of 162, by time $t_1/4$. For the next 500 microseconds, between time $t_1/4$ and time $3t_1/4$, counter 110 is disabled. At time $3t_1/4$, the up/down U/D line rises to the logic 1 level (FIG. 2k) while the $V_E$ waveform voltage again falls to the logic 0 level and enables counting in the downward direction. Down-counting of 159 cycles (plus the additional 3 cycles empirically found to occur due to U/D and $V_E$ waveform transitions) occurs, so that the count in counter 110 reaches zero and provides a transition of the $Q_d$ output. This logic 0 transition is inverted by inverter 114 and provides a positive-going MSB-B transition on line 110'.

A slope-error-signal-generator means 138 receives the MSB-B signal on line 110'. The MSB-B signal is applied to a first input 140a of a 2-input NOR gate 140. The remaining input 140b of this gate, as well as a first input 142a of another 2-input NOR gate 142, receives the $V_s$ signal. The output 140c of NOR gate 140 is connected to the remaining input 142b of gate 142 and also to the input of an inverter 144. The output 142c of gate 142 and the output of inverter 144 are applied to another error-voltage generating means 146, similar to means 102. Means 146 includes capacitors 146a and 146b, resistors 146c and 146d and diodes 146e and 146f. In manner similar to the operation of means 102, an error voltage is provided at means output 146g with magnitude and polarity responsive to the time at which the MSB-B line transition occurs with respect to the negative-going transition of the $V_s$ signal. This error voltage is integrated by an integration means 148, similar to integration means 104. Integration means 148 includes an operational amplifier 150 having a compensation resistance 148a connected to a non-inverting+ input 150a thereof, an input resistance 148b connected between output 146g and an inverting input 150a, and an integration capacitance 148c connected between input 150a and an output 150c. A second error-correction voltage $V_M$ appears at output 150c for connection to resistance 26b of divider 26. If the frequency slope of the chirp waveform is correct, counter 110 will have counted back to a zero count at the end of the chirp time interval $T_1$. If the frequency slope is too high, the positive transition on MSB-B line 110' occurs before the transition on the $V_s$ line, at the beginning of pulse 82. This timing arrangement provides a negative voltage at the $V_M$ output, changing the reference voltage at the VAC means reference input 12c' and reducing the maximum ramp voltage $V_X$, to reduce the frequency slope. Conversely, if the frequency slope is too low, the MSB-B transitional line 110 occurs after the negative-going $V_S$ transition, whereby a positive error voltage $V_M$ is produced. Responsive thereto, the DAC means reference voltage is changed such that the ramp maximum voltage $V_X$ is increased, increasing the frequency slope of the chirp. In this manner, the frequency slope of the chirp is corrected to a desired value, just as the $V_L$ voltage corrects the chirp average frequency to the predetermined desired value.

It will be seen that our novel chirped frequency automatic controller utilizes a maximum of digital circuitry and that even the traditionally "analog" components (operational amplifiers 18, 34, 106 and 150) can be provided in an integrated circuit form of system 10, realized either as a hybrid or monolithic single component. Further, variations in operational amplifier gain from circuit-to-circuit, or over time, are self-compensated for by the inherent action of the circuit, as are similar variations, up to ±30% or more, in the frequency-controlling components of the VCO means 46. Therefore, since the resistive and capacitive components of system 10 can be realized in a monolithic or hybrid embodiment of the system, and will advantageously be subjected to relatively low stress, the chirp signal average frequency and frequency slope parameters can be compensated for both over long periods of time and in a system utilizing a plurality of control systems 10, wherein these frequency chirp parameters are ultimately responsive only to the relative timing accuracy of the clock waveform introduced at input 10a. The bit clock signal at input 10b only controls the number of chirps provided in a given time.

While many modifications and variations of our novel chirp waveform digital automatic frequency control system and methods will now become apparent to those skilled in the art, it is our intent that we be limited only by the scope of the appending claims, and not by the specific details and instrumentalities presented by way of descriptive example herein.

What we claim is:

1. A method for controlling the frequency characteristics of a frequency-chirped oscillator, comprising the steps of:
   (a) providing a bit clock signal defining each of a sequence of bit time intervals;
   (b) providing a clock signal having a predetermined frequency;
   (c) generating a ramp signal responsive to counting a predetermined number of clock signal cycles during each bit time interval;
   (d) providing a variable-frequency oscillator having an output signal of instantaneous frequency responsive to the instantaneous magnitude of the ramp signal;
   (e) generating a first transition signal responsive to the occurrence of a predetermined number of oscillator output signal cycles after the start of each bit time interval;
   (f) generating a first error signal by comparison of the time at which the first transition signal occurs with respect to the time at which the associated bit time interval ends;
   (g) varying at least one characteristic of the ramp signal responsive to the first error signal to control the oscillator frequency to a selected initial value at the beginning of each bit time interval.

2. The method of claim 1, wherein step (e) includes the steps of: providing means for counting the number of cycles of the oscillator output signal; presetting the counting means to an initial count immediately prior to the start of each bit time interval; and counting the oscillator output signal cycles in the counting means during each bit time interval to cause the counting means to overflow and provide the first transition signal when the predetermined number of oscillator cycles has occurred after the start of each bit time interval.

3. The method of claim 1, wherein step (f) further includes the step of integrating the first error signal prior to varying the at least one ramp signal characteristic therewith.

4. The method of claim 1, wherein step (c) further includes the steps of: counting the clock signal frequency through sequential digital states during each bit time interval; converting the sequential digital count states to a staircase signal waveform; and providing the staircase signal waveform with a D.C. offset voltage amplitude responsive to the first error signal.

5. The method of claim 4, further including the step of: at least partially integrating the staircase signal waveform to provide the ramp signal.

6. The method of claim 4, further comprising the step of resetting the digital count state to a digital zero count immediately prior to the start of each bit time interval.

7. The method of claim 1, further comprising the step of disabling the oscillator output signal between each adjacent pair of bit time intervals.

8. The method of claim 1, further comprising the steps of:
   (h) counting the number of cycles in the oscillator output signal during a first fixed-duration interval at the beginning of each bit time interval;
   (i) counting the number of cycles in the oscillator output signal during a second time interval, of the same fixed-duration as the first interval, at the end of the same bit time interval;
   (j) generating a second transition signal when the number of counts in the second interval is a predetermined number of counts greater than the number of counts in the first interval;
   (k) generating a second error signal by comparison of the time at which the second transition signal occurs with respect to the time at which the associated bit time interval ends; and
   (l) varying another characteristic of the ramp signal responsive to the second error signal to control the rate of change of the oscillator frequency to a selected value.

9. The method of claim 8, wherein step (h) includes the steps of: providing means for bidirectionally counting the number of cycles of the oscillator output signal; presetting the bidirectional counting means to a predetermined count immediately prior to the start of each bit time interval; controlling the bidirectional counting means to count in the first direction during the first interval; counting the oscillator output signal cycles in the first direction during the first time interval; and step (i) includes the steps of: controlling the bidirectional counter to count in a second direction, opposite to said first direction, during the second time interval; and counting the oscillator output signal cycles in the second direction during the second time interval.

10. The method of claim 9, further comprising the step of disabling counting in the bidirectional counting means at all times other than the first and second intervals.

11. The method of claim 8, wherein step (k) further includes the step of integrating the second error signal prior to varying the additional ramp signal characteristic therewith.

12. The method of claim 8, wherein step (l) includes the step of varying the time-rate-of-change of the ramp signal responsive to the second error signal.

13. Apparatus for providing a frequency-chirped signal with controllable frequency characteristics, comprising:
a first input terminal receiving a clock signal having a predetermined frequency;
a second input terminal receiving a bit clock signal defining each of a sequence of bit time intervals;
an output terminal;
means receiving said clock signal and said bit clock signal for forming a frequency-controlling ramp signal during each bit time interval;
an oscillator having an input receiving the ramp signal, and an output coupled to said output terminal and providing an output signal having an instantaneous frequency responsive to the instantaneous magnitude of said ramp signal;
means for generating a first transition signal responsive to counting a predetermined number of oscillator output signal cycles after the start of each bit time interval;
means for generating a first error signal by comparison of the time at which the first transition signal occurs with respect to the time at which the associated bit time interval ends; and
means cooperating with said ramp-signal-forming means for varying at least one characteristic of the ramp signal responsive to the first error signal to control the oscillator output signal frequency to a selected initial value at the beginning of each bit time interval.

14. The apparatus of claim 13, wherein said ramp-signal-forming means comprises: means for counting the clock signal frequency through sequential digital states during each bit time interval; and means for converting the sequential digital count states to a staircase signal waveform having a D.C. offset voltage of magnitude responsive to the first error signal.

15. The apparatus of claim 14, further including means for at least partially integrating the staircase signal waveform to provide the ramp signal.

16. The apparatus of claim 14, wherein said clock signal counting means comprises a frequency divider having a plurality of stages each having an output, the totality of stage outputs providing a like plurality of signals defining a preset digital count state.

17. The apparatus of claim 16, wherein said divider is a binary divider receiving said clock signal.

18. The apparatus of claim 14, wherein said converting means includes a digital-to-analog converter having a like plurality of digital inputs, each coupled to a like one of the plurality of counter stage outputs, and an output at which the staircase signal waveform appears with magnitude responsive to the sequential digital count states at said digital inputs.

19. The apparatus of claim 18, wherein said varying means comprises a waveform adder having a first input receiving the staircase signal waveform, a second input receiving the first error signal, and an output at which said ramp signal appears as said staircase signal with a D.C. offset voltage of magnitude responsive to the first error signal.

20. The apparatus of claim 14, further comprising means for resetting the digital count states in said counting means to a digital zero count immediately prior to the start of each bit time interval.

21. The apparatus of claim 20, wherein said resetting means includes logic gating means receiving said bit clock signal and the most-significant-bit stage output of said counting means, for resetting said counting means at the end of each bit time interval.

22. The apparatus of claim 13, wherein said first transition signal generating means comprises a counter having a second plurality of stages, each having a presetting input and a stage output; means, coupled to at least each stage input, for presetting the associated stage outputs to a predetermined digital count immediately prior to the start of each bit time interval, to cause the most-significant-bit stage output of said counter to change state and form said first transition signal when a predetermined number of oscillator output signal cycles have been counted above the digital count preset into said counter prior to the start of counting therein.

23. The apparatus of claim 13, wherein said first error signal generating means includes means for generating a first signal of magnitude and polarity determined by a comparison of the time at which the first transition signal occurs with respect to the time at which the associated bit time interval ends; and means for integrating the first signal to form said first error signal.

24. The apparatus of claim 13, further including:
means for generating a second transition signal responsive to counting a predetermined number of oscillator output signal cycles in a first direction during a first one-quarter of the bit time interval and to counting another predetermined number of oscillator output signal cycles in a second direction, oppositve to the first direction, in the last one-quarter of each bit time interval;
means for generating a second error signal by comparison of the time at which said transition signal occurs with respect to the time at which the associated bit time interval ends; and
means, cooperating with said ramp-signalforming means, for varying another characteristic of the ramp signal responsive to said second error signal to control the time-rate-of-change of the oscillator output signal frequency to a selected value.

25. The apparatus of claim 24, wherein said second transition signal generating means comprises: a bidirectional counter having a third plurality of stages, each stage having a presetting input and a stage output, said bidirectional counter having a control input for controlling the direction of counting in said counter to one of said first and second directions; means coupled to at least each stage input of said bidirectional counter for presetting the associated stage outputs to a predetermined digital counted immediate prior to the start of each bit time interval, to cause a predetermined stage output to change state and form said second transition signal when a predetermined number of oscillator output signal cycles have been counted in said first direction and above the digital count preset into said bidirectional counter prior to the start of counting therein, and after another predetermined number of oscillator output cycles have then been counted in said second direction;

and means coupled to said counting direction input for determining the counting direction of said bidirectional counter.

26. The apparatus of claim 25, wherein said ramp-forming means provides a most-significant-bit signal having a cycle time interval equal to said bit time interval and a second-most-significant-bit signal having a cycle time interval equal to one-half the bit time interval; and said direction-controlling means includes logic means receiving said most-significant-bit and said second-most-significant-bit signals for enabling said third counter to count in said first direction during the first one-quarter of each bit time interval and in said second direction during the fourth one-quarter of the same bit time interval.

27. The apparatus of claim 24, wherein said second error signal generating means includes means for generating a second signal of magnitude and polarity determined by a comparison of the time at which the second transition signal occurs with respect to the time at which the associated bit time interval ends; and means for integrating the second signal to form said second error signal.

28. The apparatus of claim 24, wherein said converting means includes a digital-to-analog converter having a reference input receiving a reference signal of magnitude at least partially dependent upon the magnitude of said second error signal; a plurality of digital inputs receiving a sequential digital count responsive to the number of clock signals appearing during each bit time interval; and an output at which said ramp signal waveform appears with a ramp magnitude responsive to the magnitude of the second error signal at said reference input.

* * * * *